United States Patent
Gardner et al.

[11] Patent Number: 5,969,407
[45] Date of Patent: Oct. 19, 1999

[54] MOSFET DEVICE WITH AN AMORPHIZED SOURCE

[75] Inventors: Mark I. Gardner, Cedar Creek; H. Jim Fulford, Jr.; Derick J. Wristers, both of Austin, all of Tex.

[73] Assignee: Advanced Micro Devices, Inc., Sunnyvale, Calif.

[21] Appl. No.: 09/050,552

[22] Filed: Mar. 30, 1998

Related U.S. Application Data

[62] Division of application No. 08/811,417, Mar. 4, 1997, Pat. No. 5,770,485.

[51] Int. Cl.$^6$ ................................... H01L 29/12
[52] U.S. Cl. .................. 257/607; 257/610; 257/617; 438/162
[58] Field of Search ................... 257/607, 610, 257/612, 616, 617; 438/162, 511, 520, 528, 378

[56] References Cited

U.S. PATENT DOCUMENTS

| | | | |
|---|---|---|---|
| 5,134,447 | 7/1992 | Ng et al. | 257/616 |
| 5,245,208 | 9/1993 | Eimori | 257/616 |
| 5,258,319 | 11/1993 | Inuishi et al. | |
| 5,278,082 | 1/1994 | Kawamura | |
| 5,286,664 | 2/1994 | Horiuchi | |
| 5,338,960 | 8/1994 | Beasom | |
| 5,360,749 | 11/1994 | Anjum et al. | |
| 5,366,915 | 11/1994 | Kodama | |
| 5,420,055 | 5/1995 | Vu et al. | |
| 5,432,106 | 7/1995 | Hong | |
| 5,547,885 | 8/1996 | Ogoh | |
| 5,561,072 | 10/1996 | Saito | |
| 5,578,509 | 11/1996 | Fujita | |
| 5,585,286 | 12/1996 | Aronowitz et al. | |
| 5,633,177 | 5/1997 | Anjum | |

OTHER PUBLICATIONS

Silicon Processing for the VLSI Era—Vol. 1: Process Technology, by S. Wolf, published by Lattice Press, Sunset Beach, CA, 1986, pp. 182–327.

Silicon Processing for the VLSI Era—Vol. 2: Process Integration, by S. Wolf, published by Lattice Press, Sunset Beach, CA, 1990, pp. 124–131.

Primary Examiner—David B. Hardy
Attorney, Agent, or Firm—Skjerven, Morrill, MacPherson, Franklin & Friel LLP; Ken J. Koestner

[57] ABSTRACT

An amorphized implant is performed to retard diffusion of ions in the source and drain regions. By retarding the diffusion of ions in these regions, a shallower junction is advantageously created in the silicon regions of the wafer. A slight degradation in leakage current is obtained if the amorphized implant is performed on both the source and the drain sides of a transistor. However, since the source region is a low voltage region with a very shallow junction, MOSFETs in both n-channel and p-channel regions are formed with improved performance and reliability.

A method of fabricating an integrated circuit includes forming a gate electrode over a semiconductor substrate, forming a source mask extending over the drain region of the semiconductor substrate, and implanting an implant species into the source region of the semiconductor substrate to form an amorphous implant layer of the semiconductor substrate. The semiconductor substrate has a source region adjacent to a first side of the gate electrode and has a drain region adjacent to a second side of the gate electrode. The amorphous implant layer is self-aligned with the source mask and extends through the exposed region of the semiconductor substrate and the source region of the semiconductor substrate. The method further includes the step of implanting a source implant into the exposed region of the semiconductor substrate and the source region of the semiconductor substrate to form a source implant layer of the semiconductor substrate. The source implant layer extends a shallower depth into the semiconductor substrate than the amorphous implant layer.

3 Claims, 8 Drawing Sheets

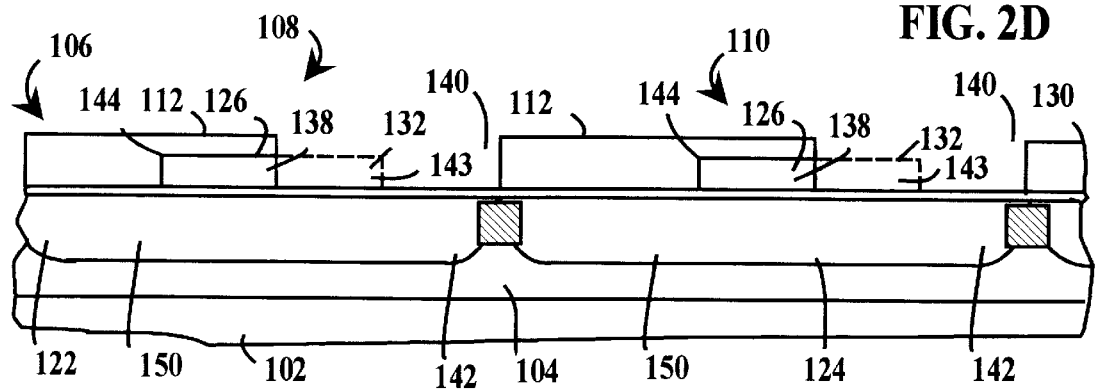
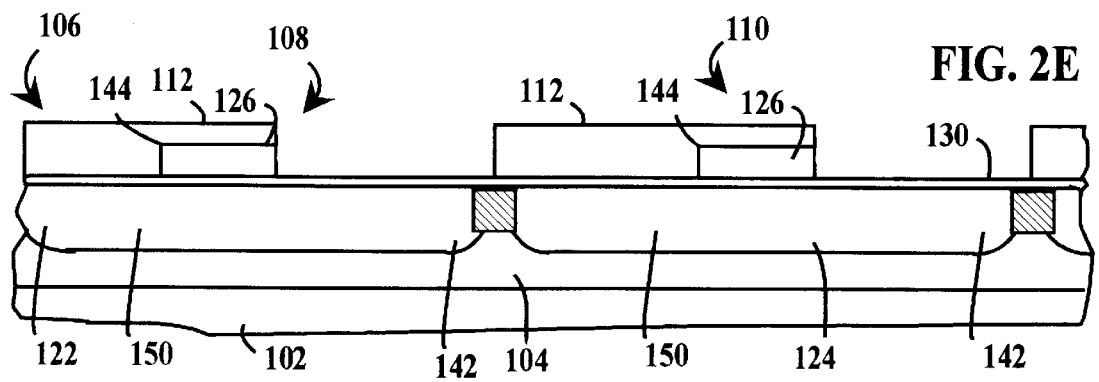
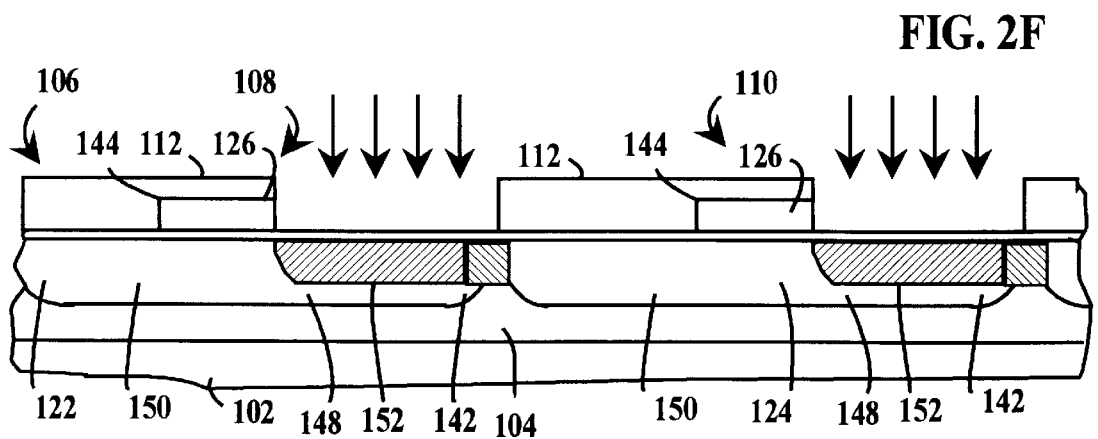

MOSFET DEVICE WITH AN AMORPHIZED SOURCE

This application is a division of application Ser. No. 08/811,417, filed Mar. 4, 1997, which was granted U.S. Pat. No. 5,770,485 on Jun. 23, 1998.

BACKGROUND OF THE INVENTION

1. Field of the Invention

The present invention relates to a semiconductor device and fabrication method. More specifically, the present invention relates to a semiconductor device and fabrication method including an amorphized source to improve hot-carrier reliability.

2. Description of the Related Art

Hot-carrier effects cause unacceptable performance degradation in MOSFET devices built with conventional drain structures when channel lengths are short. As the dimensions of MOSFET devices are reduced and the supply voltage remains constant or is not reduced as rapidly as the structures are reduced in scale, the lateral electric field in the channel increases. Increases in the lateral electric field cause acceleration and heating of inversion-layer charges, resulting in multiple harmful device phenomena, called "hot-carrier" effects. A particularly destructive hot-carrier effect is damage to the gate oxide or the silicon-oxide interface of a device leading to time-dependent degradation of various MOSFET characteristics including threshold voltage $V_T$, linear region transconductance $g_M$, subthreshold slope $S_t$, saturation current $I_{dsat}$, and ultimately device lifetime.

Hot-carrier degradation is reduced by decreasing the magnitude of the maximum channel electric field $\epsilon_{ymax}$ located at the drain end of the channel and by separating the maximum current path in the channel from the location of the maximum electric field location. Reduction of the maximum channel electric field $\epsilon_{ymax}$ and separation of the maximum current path are achieved by modifying the structure of a MOSFET using special drain field-reducing structures and by increasing the resistance of the gate oxide and silicon-oxide interface to hot-carrier degradation through the use of special processing techniques.

A common modified MOSFET structure for reducing hot-carrier effects is called a lightly doped drain (LDD) structure in which a lightly doped ($n^-$) buffer region is formed between a heavily arsenic-doped ($n^+$) drain and the channel, outside of the channel. The drain is formed by two implants including a first implant self-aligned to the gate electrode and a second implant self-aligned to the gate electrode and sidewall spacers formed lateral to the gate electrode. Accordingly, the MOSFET includes a drain with a graded or lightly-doped extension. The maximum channel electric field $\epsilon_{ymax}$ is reduced by forming this buffer region because the maximum electric field in a reverse-biased pn junction is highest when the junction is abrupt. In the lightly doped drain (LDD) structure, an abrupt drain doping profile is replaced by a more gradually decreasing, or graded, profile so that the voltage drop is shared by the drain and the channel.

However, in many cases LDD devices have been unable to improve or even attain the same hot-carrier reliability as conventional single-drain MOSFETs. The poor performance of early LDD devices resulted from an erroneous or incomplete understanding of the electrical behavior of the LDD structure. For example, reduction of maximum channel electric field $\epsilon_{ymax}$ was considered to be of fundamental importance for improving hot-carrier reliability. However, it was subsequently determined that other parameters including the spatial location of the $\epsilon_{ymax}$ point, the spatial offset of the lightly doped dose from gate edge, the thermal budget following the lightly doped drain implant, doping concentrations within the channel, and the like are important for determining MOSFET behavior. In particular, it has been determined that hot-carrier resistance is optimized using an LDD structure in which the heavily doped $n^+$ region is located at the edge or just under the edge of the gate, and the lightly-doped $n^-$ region should be located entirely under the gate. Unfortunately, this optimum structure is difficult to fabricate. Specifically, attaining full lightly-doped $n^-$ overlap using an oxide-spacer-based LDD design requires the use of a very narrow spacer in combination with a substantial thermal drive-in. Unfortunately, in submicron CMOS technologies, such a combination causes the source/drain junctions in both NMOS and PMOS transistors to be too deep to control short-channel effects.

Several approaches have been developed for improving the characteristics of an LDD MOSFET. First, the doping concentration in the lightly doped $n^-$ region of the LDD structure is increased to improve the drive-current capability and reduce a "structural degradation effect" that degrades the hot-carrier lifetime of a conventional LDD MOSFET. Second, the vertical profile of the lightly doped $n^-$ region is modified to steer a current path away from the surface of the MOSFET and to separate the location of $\epsilon_{ymax}$ and the path of maximum current flow in the MOSFET. Third, dopants are selectively implanted beneath the lightly doped $n^-$ region to reduce the susceptibility of submicron LDD structures to short-channel effects What is needed is a technique for fabricating MOSFET devices that substantially improves hot-carrier reliability while maintaining fabrication simplicity. What is further needed is a semiconductor fabrication method that retards diffusion of ions in source/drain regions.

SUMMARY OF THE INVENTION

Ion implantation is a process for introducing selected impurity atoms into predetermined areas of a semiconductor substrate to modify the electrical properties of the substrate. The ion implantation process involves a direct injection of energetic, charged atoms or molecules into a substrate at acceleration energies typically ranging from 10 to 200 keV. Ion implantation achieves precise control of the concentration of ions implanted into a substrate, resulting in a tight lateral distribution of ions which is useful for production of compact circuits and systems.

Although ion implantation is highly advantageous for forming precise doped regions in a substrate, the process does have some disadvantages. For example, ion implantation cannot be achieved without causing damage (displaced atoms) to the material structure of the substrate. Damage includes crystal defects and formation of amorphous layers in crystalline targets. Furthermore, the impurities that are injected into the substrate are generally not positioned in substitutional sites that are suitable for electrical activation of the semiconductor.

It has been discovered that an otherwise disadvantageous characteristic of ion implantation can be exploited to create amorphous implants in selected areas of a substrate to improve semiconductor device performance. An amorphized implant is performed to retard diffusion of ions in the source and drain regions. By retarding the diffusion of ions in these regions, a shallower junction is advantageously created in the silicon regions of the wafer. A slight degradation in leakage current is obtained if the amorphized implant is performed on both the source and the drain sides of a transistor. However, since the source region is a low voltage region with a very shallow junction, MOSFETs in both n-channel and p-channel regions are formed with improved performance and reliability.

In accordance with an embodiment of the present invention, amorphized implants are performed to retard diffusion of source/drain regions of a MOSFET device, creating a shallower junction in the silicon regions of a substrate wafer. Amorphized implants on both source and drain sides of the MOSFET device attain a reduction in leakage current.

In accordance with a further embodiment of the present invention, amorphized implants on only the source side of a MOSFET device achieve a very shallow junction in the low-voltage source regions for both n-channel and p-channel regions of a circuit to attain substantially improved performance and reliability.

In accordance with an embodiment of the present invention, a method of fabricating an integrated circuit includes forming a gate electrode over a semiconductor substrate. The semiconductor substrate has a source region adjacent to a first side of the gate electrode and has a drain region adjacent to a second side of the gate electrode. The method further includes forming a source mask extending over the drain region of the semiconductor substrate and extending to partially cover the gate electrode. A portion of the gate electrode that is partially covered is a protected portion of the gate electrode and a portion of the gate electrode that is uncovered is an exposed portion of the gate electrode. The method further includes removing the exposed portion of the gate electrode with the removed portion of the gate electrode exposing a region of the semiconductor substrate. The method includes implanting an implant species into the source region of the semiconductor substrate to form an amorphous implant layer of the semiconductor substrate. The amorphous implant layer is self-aligned with the source mask and extends through the exposed region of the semiconductor substrate and the source region of the semiconductor substrate. The method includes implanting a source implant into the exposed region of the semiconductor substrate and the source region of the semiconductor substrate to form a source implant layer of the semiconductor substrate. The source implant layer extends a shallower depth into the semiconductor substrate than the amorphous implant layer.

In accordance with a further embodiment of the present invention, an integrated circuit includes a semiconductor substrate and a gate electrode over the semiconductor substrate. The gate electrode has a gate width smaller than the minimum resolution of a photolithographic system used to etch the gate electrode. The integrated circuit further includes a source region in the semiconductor substrate adjacent to a first side of the gate electrode, a drain region in the semiconductor substrate adjacent to a second side of the gate electrode, and an amorphous implant implanted into the source region of the semiconductor substrate. The amorphous implant is self-aligned with the gate electrode and asymmetrically implanted into the source region in exclusion of the drain region. The integrated circuit further includes a source implant implanted into the source region of the semiconductor substrate to a depth shallower than the depth of the amorphous implant and a drain implant implanted into the drain region of the semiconductor substrate.

Many advantages are gained by the described method. The amorphized implant retards diffusion in the source/drain regions advantageously forming a shallower junction in the silicon wafer. A slight degradation in leakage current is obtained if the amorphized implant is performed on both the source and the drain sides of a transistor. However, since the source region is a low voltage region with a very shallow junction, MOSFETs in both n-channel and p-channel regions are formed with improved performance and reliability.

Ion implantation greatly improves control of the dopant concentration within the substrate, however additional control is needed to further reduce structure sizes and to improve the precision of dopant concentrations within the substrate, particularly in the vicinity of junctions. Usage of the amorphized implant supplies the additional control of dopant concentration to advantageously improve transistor performance. Improved control achieved using the amorphized implant is particularly useful for precisely setting threshold voltage $V_T$ and preventing "punchthrough".

The amorphized implant converts a region of the silicon substrate from a crystalline structure to an amorphous structure so that individual dopants or impurities are individually excited without driving or diffusing the impurities too deep into the substrate. Shallow junctions are advantageously formed and impurities are more completely activated.

BRIEF DESCRIPTION OF THE DRAWINGS

The features of the described embodiments believed to be novel are specifically set forth in the appended claims. However, embodiments of the invention relating to both structure and method of operation, may best be understood by referring to the following description and accompanying drawings.

FIGS. 2A through 2I are schematic cross-sectional views of a semiconductor wafer illustrating, in detail, successive process steps for forming an amorphized source MOSFET in accordance with the first embodiment of the present invention.

DETAILED DESCRIPTION OF THE ILLUSTRATIVE EMBODIMENTS

Figure 1A:
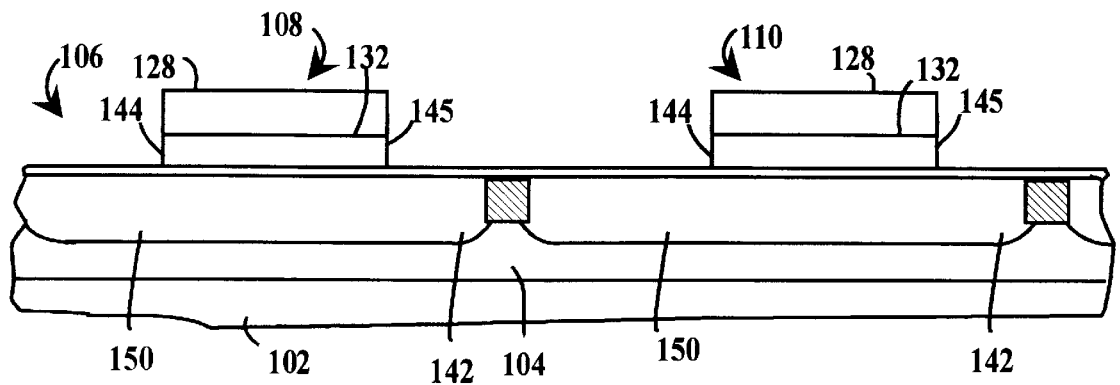
FIGS. 1A through 1F are schematic cross-sectional views of a semiconductor wafer illustrating, in summary, several pertinent process steps for forming an amorphized source MOSFET in accordance with a first embodiment of the present invention.

Referring to FIGS. 1A through 1F, schematic cross-sectional views of a semiconductor wafer summarize several pertinent process steps for forming an amorphized source MOSFET. Referring to FIG. 1A, a schematic cross-sectional view illustrates a silicon wafer 106 following formation of gate electrodes 132 for fabrication of an n-channel transistor 108 and a p-channel transistor 110. The n-channel transistor 108 and the p-channel transistor 110 each include a source region 142 and a drain region 150 in a silicon wafer 106 formed of a silicon substrate 102 and an epitaxial layer 104 that are subsequently doped to form operational transistors.

Figure 1B:
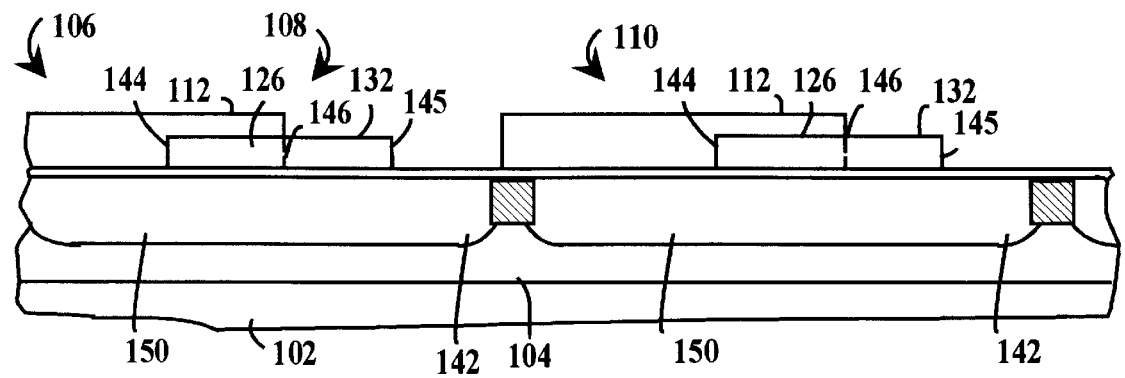

The gate electrodes 132 are etched using conventional photolithographic techniques, applying a first gate photoresist mask 128 to cut a first edge 144 and a second edge 145 and forming a gate width that is determined by the resolution of the photolithographic system. The first gate photoresist mask 128 includes an opening that defines the first edge 144 and the second edge 145 of the gate electrode 132. Referring to FIG. 1B, a nonconventional gate etch technique is used to form a reduced-size gate electrode 126 in which the length between the first edge 144 and a new second edge 146 of the gate electrode 126 is not limited by the minimum resolution of a photolithographic system.

The reduced-size of the gate electrode 126 is achieved by forming two masks, the first gate photoresist mask 128 for defining the size of the gate electrodes 132 and setting the first edge 144 of the gate electrodes 132, and a second mask herein termed a source mask 112 shown.

Figure 1C:
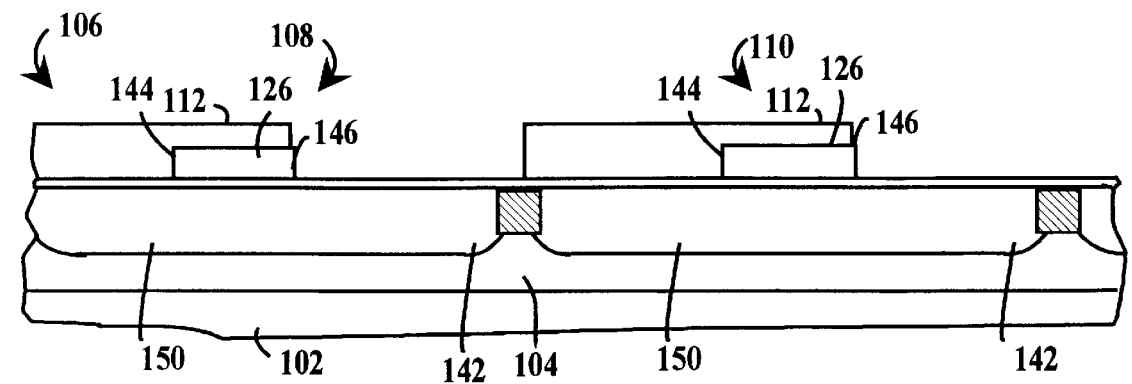

Referring to FIG. 1C, a portion of the gate electrode 132 is removed to form a reduced-size gate electrode 126 by forming the source mask 112 overlying the drain region 150 of the silicon wafer 106 and overlying a portion of the gate electrodes 132. The source mask 112 has an opening defining a second edge 146 of the reduced-size gate electrode 126 and extending across the source region 142 so that the source region 142 is exposed.

Figure 1D:
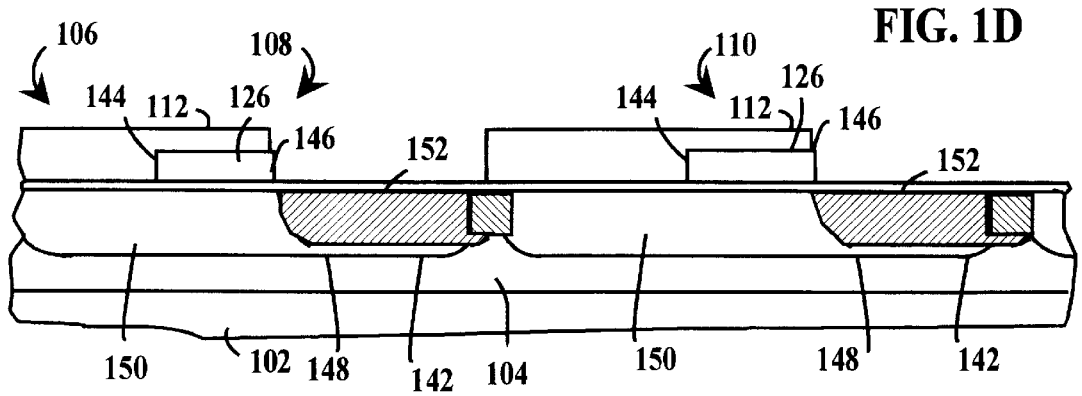

Referring to FIG. 1D, while the source mask 112 is in position, an amorphized implant 152 is implanted to create an amorphous layer a relatively deep depth into the silicon wafer 106 in the source region 142 and the region 148 near the source region 142. The amorphized implant retards diffusion in the source/drain regions advantageously forming a shallower junction in the silicon wafer 106. Suitable amorphized implant 152 species include silicon (Si), argon (Ar), germanium (Ge), cobalt (Co) and carbon (C), for example. In some embodiments, an annealing procedure is applied following the amorphized implant 152 and prior to a source implant.

Figure 1E:
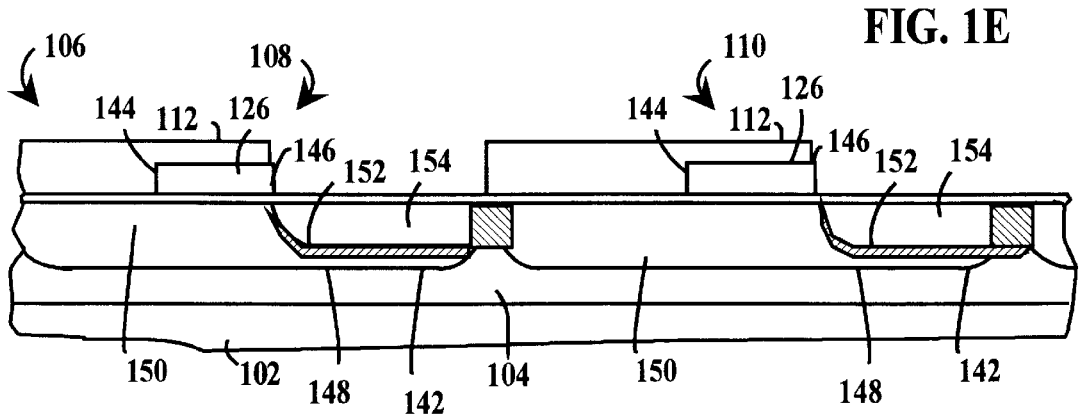

Referring to FIG. 1E, a source implant 154 is implanted into the source region 142 and the region 148 in the vicinity of the source region 142 while the source mask 112 remains in position The source implant 154 is implanted to depth that is substantially shallower than the amorphized implant 152. The amorphized implant 152 is implanted substantially deeper than the source implant 154 and LDD implants to restrict the diffusion of boron and arsenic into the region 148 on the source side of the reduced-size gate electrode 126.

Figure 1F:
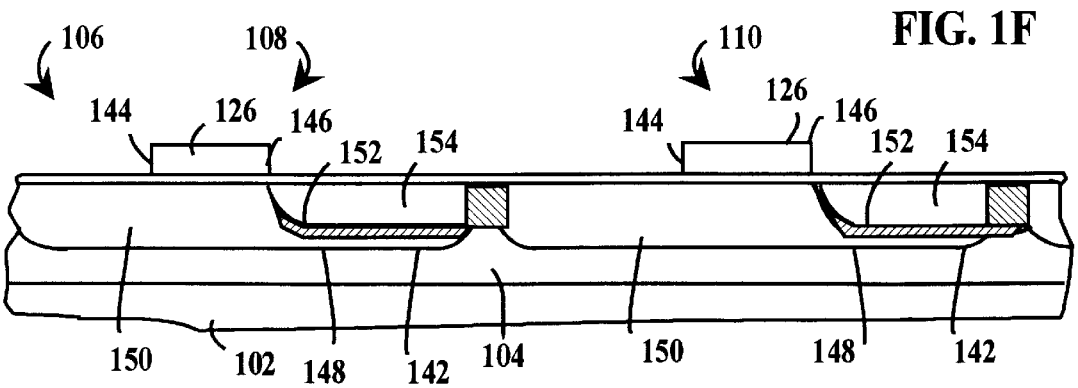

Referring to FIG. 1F, the source mask 112 is stripped and the fabricated transistors have a reduced-size gate electrode 126 which is defined by a lateral displacement between the openings in the first gate photoresist mask 128 and the source mask 112. In subsequent steps, LDD regions are formed for both n-channel transistor 108-and p-channel transistor 110, sidewall spacers (not shown) are formed on the sides of the reduced-size gate electrodes 126, heavily doped n$^+$ and p$^+$ regions are formed, and the silicon wafer 106 is annealed, typically using a rapid thermal anneal procedure.

Referring to FIGS. 2A through 2I, a sequence of cross sectional views of a section of a semiconductor wafer 100 are shown to illustrate the processing steps discussed in reference to FIGS. 1A through 1F with additional detail.

Figure 2A:
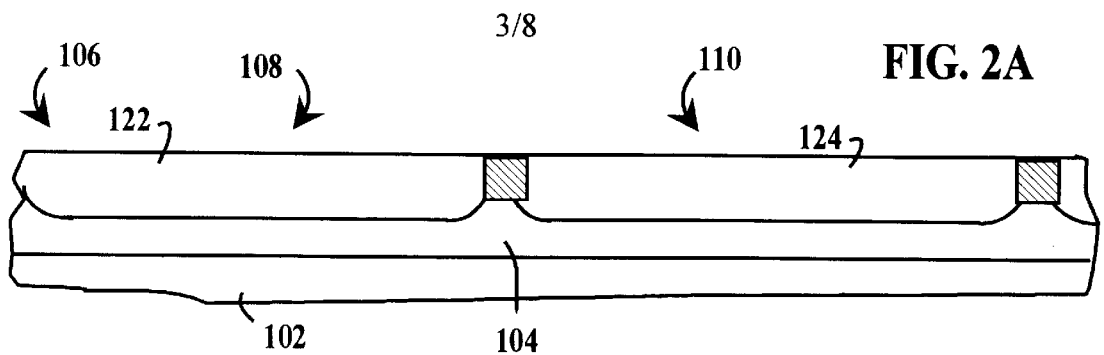

Referring to FIG. 2A, various suitable processing steps are performed to form a plurality of transistor structures. In one exemplary embodiment, NMOS devices in an N-well technology are formed in a lightly doped P-substrate having a P-type impurity concentration of less than approximately $5 \times 10^{15}/cm^3$ and PMOS devices are formed in a more heavily-doped N-type substrate having an impurity concentration of above $5 \times 10^{15}/cm^3$. The starting material is typically a heavily-doped <100>-orientation silicon substrate 102 upon which a thin (5 $\mu$m to 10 $\mu$m) lightly-doped epitaxial layer 104 is grown. Either an n-epi-on-n$^+$ or a p-epi-on-p$^+$ substrate may be used. The a p-epi-on-p$^+$ substrate is more typically used due to a lesser sensitivity to process-induced defects. The silicon substrate 102 and the epitaxial layer 104 in combination form a silicon wafer 106.

N-wells 122 and P-wells 124 are formed in the silicon wafer 106 so that both an n-channel transistor 108 and a p-channel transistor 110 is fabricated in the same wafer in CMOS technologies. N-wells 122 and P-wells 124 are regions of opposite doping that are the first features defined on a silicon wafer 106. N-wells 122 and P-wells 124 are formed by implanting and diffusing appropriate dopants, for example phosphorus or arsenic for N-wells 122 and boron for P-wells 124 to attain a suitable well depth and doping profile. The twin wells may be formed using various techniques. In one example, the two wells are formed using two masking steps, each of which blocks one of the well implants. A single-masking procedure is more typically used.

Figure 2B:
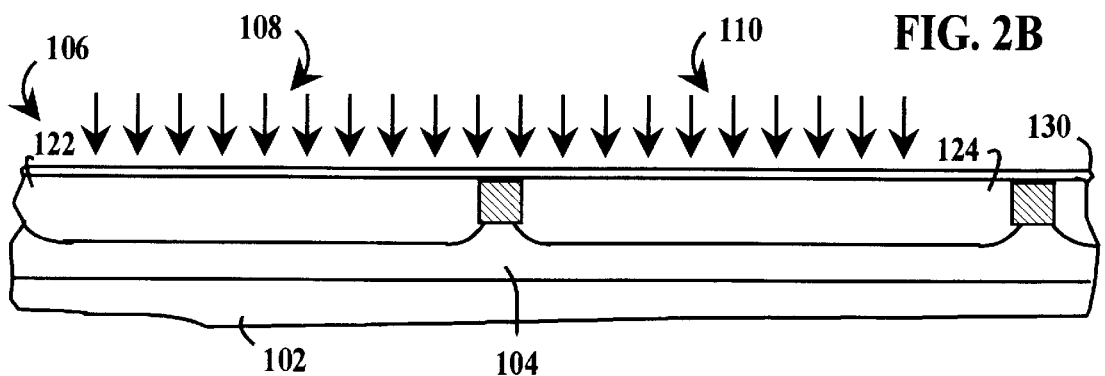

Referring to FIG. 2B, a gate oxide layer 130 is grown overlying the silicon wafer 106 and the threshold voltage $V_T$ of both enhancement mode and depletion mode transistors are adjusted using ion implantation. The gate oxide layer 130 is free of defects, has a thickness in a range from 30 Å to 150 Å, is a high-quality oxide, and contamination-free. The gate oxide layer 130 is generally composed of silicon dioxide and is formed on the top surface of the silicon wafer 106 using tube growth at a temperature of 700 to 1000° C. in an $O_2$ ambient. The gate oxide layer 130 is grown only in exposed active regions of the silicon wafer 106. The gate oxide layer 130 is formed as thin as possible to increase drain current, but formed sufficiently thick to avoid oxide breakdown and attain reliable operation. Ion implantation is used to set threshold voltage $V_T$, advantageously allowing the threshold voltage $V_T$ to be set independently of substrate doping, allowing substrate doping to be set on the basis of device performance alone.

Adjustment of threshold voltage $V_T$ is achieved by implanting impurities such as boron, phosphorus, or arsenic ions into regions beneath the gate oxide of a MOSFET. Boron atoms positively shift threshold voltage $V_T$. Phosphorus or arsenic atoms negatively shift threshold voltage $V_T$. The threshold voltage $V_T$ adjustment implant is performed either with a single boron implant or separate p-type and n-type implants using additional masking steps.

Threshold adjustment implants and punchthrough implants may be performed either before or after gate-oxide growth. In conventional devices, the threshold voltage $V_T$ adjustment implant is injected through the gate oxide layer to limit depth of the boron threshold adjustment implant to a shallow depth. A suitable threshold voltage $V_T$-adjust implant energy forms an implant with a peak concentration at the oxide-silicon interface. A subsequent implant-activating anneal operation distributes the implanted ions more broadly than the implanted profile.

In an illustrative embodiment, a threshold voltage $V_T$ adjustment implant for enhancement-mode devices is performed. For example, boron is implanted through the gate oxide layer 130 at a concentration in a range from approximately $10^{12}$ to $10^{13}$ atoms/cm$^2$ and an energy in the range from about 50 keV to 100 keV, an energy insufficient to penetrate a trench or field oxide isolation (not shown). The $V_T$ adjustment implant for enhancement-mode devices is typically performed without masking.

A threshold voltage $V_T$ adjustment implant for depletion-mode devices is performed by implanting areas of depletion-mode devices with phosphorus or arsenic atoms at a concentration of about $2 \times 10^{12}$ to $5 \times 10^{12}$ atoms/cm$^2$ and an implant energy in the range of about 100 keV. The implant dosage is adjusted to overcompensate for the boron threshold voltage $V_T$ adjustment implant for enhancement-mode devices. The depletion-mode implant is performed with a photoresist mask to selectively locate the depletion-mode transistor channels.

Figure 2C:
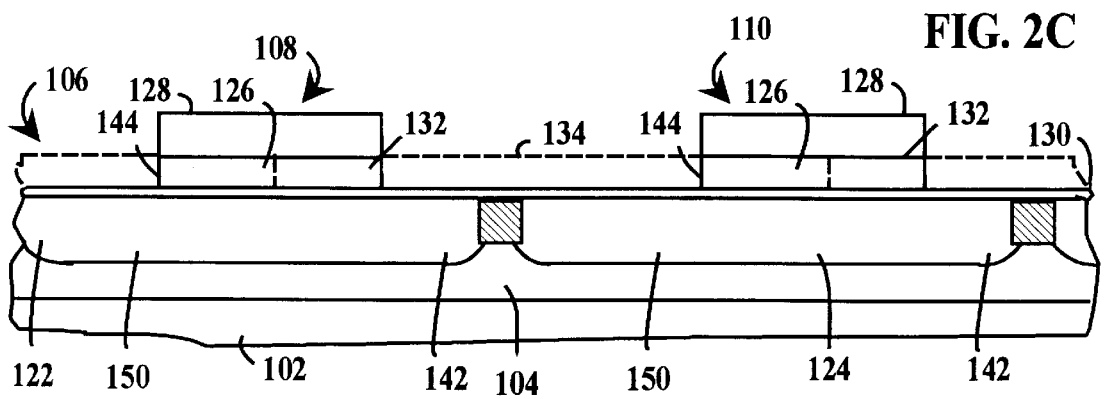

Referring to FIG. 2C, gate electrodes 132 for the n-channel transistor 108 and the p-channel transistor 110 are formed by polysilicon deposition and patterning. A layer of polysilicon 134 is deposited by low pressure chemical vapor deposition (LPCVD) overlying the entire silicon wafer 106. A suitable sheet resistance is formed. In some embodiments, the layer of polysilicon 134 is doped with phosphorus by ion implantation or diffusion. In other embodiments, composite polycide layers of refractory metal suicides and polysilicon are formed. In still other embodiments, self-aligned silicided gate and source/drain regions for formed using a salicide process to reduce parasitic resistance of the source and drain regions, and the gate material.

In the illustrative embodiment, the layer of polysilicon 134 is deposited to a thickness of about 2000 Å. The layer of polysilicon 134 is doped using various techniques. In some embodiments, the layer of polysilicon 134 is doped in situ during deposition. In other embodiments, the layer of polysilicon 134 is doped before being etched by implanting arsenic with a dosage in the range of $1 \times 10^{15}$ to $5 \times 10^{16}$ atoms/cm$^2$ and an energy in the range of 2 to 50 kiloelectron-volts. In still other embodiments, the layer of polysilicon 134 is doped during a subsequent process step when a dopant is introduced into the silicon wafer 106.

After forming the first gate photoresist mask 128, a portion of the gate electrodes 132 is removed to form a reduced-size gate electrode 126 having the first edge 144 of the educed-size gate electrode 126. The layer of polysilicon 134 is etched to form the gate electrodes 132 using an anisotropic dry etch is applied that is highly selective of polysilicon. A first gate photoresist mask 128 protects the region of the gate electrodes 132 but leaves a source region 142 and a drain region 150 unprotected. The gate electrodes 132 and polysilicon interconnect structures (not shown) are patterned and etched using the first gate photoresist mask 128 to form a gate-length that is precisely maintained across the entire silicon wafer 106 and wafer to wafer since the drain current $I_D$ is strongly dependent on gate dimensions. The first gate photoresist mask 128 includes an opening that defines the first edge 144 of the gate electrode 132.

Referring to FIG. 2D, the first gate photoresist mask 128 is removed and a second mask, called a source mask 112, is formed overlying the surface of the silicon wafer 106 by depositing a layer of photoresist on the surface and patterning the source mask 112 so that the source mask 112 is removed overlying a source region 114 and a portion of the gate electrode 132. The source mask 112 has an opening defining a second edge of the reduced-size gate electrode 126. The source mask 112 is a photoresist mask which is deposited as a continuous layer and irradiated using a photolithographic system, such as a step and repeat optical projection system, in which I-line ultraviolet light from a mercury-vapor lamp is projected through a reticle and a focusing lens to obtain the desired image pattern on the source mask 112. Thereafter, the source mask 112 is developed and irradiated portions are removed to form openings. In an illustrative method, the minimum resolution (i.e. linewidth and spacing) of a step and repeat system is 4000 Å (0.41$\mu$) so that the source mask 112 has a linewidth of approximately 4000 Å that covers a drain region 156 and a first portion 138 of the gate electrodes 132 for both the n-channel transistor 108 and the p-channel transistor 110. Openings 140 in the source mask 112 expose a source region 142 and a second portion 143 of the gate electrodes 132.

The pattern of the source mask 112 is chosen to attain a selected gate width reduction and channel length reduction.

Referring to FIG. 2E, the gate electrodes 132 are etched using an anisotropic dry etch is applied that is highly selective of polysilicon so that an additional portion of the reduced-size gate electrode 126 is removed to form the second edge of the reduced-size gate electrode 126. The resulting reduced-size gate electrode 126 is defined by a lateral displacement between the openings in the first and second masks. Following etching of the gate electrodes 132 to form the reduced-size gate electrode 126, the source mask 112 remains covering the drain region 150 and the reduced-size gate electrode 126.

However, the source region 142 and a region 148 formerly underlying the gate electrodes 132 are exposed.

In various embodiments, the dimensions of the source mask 112 are varied to achieve a desired amount of gate size reduction. For example, in some embodiments, the gate electrodes 132 may not be etched at all to form the reduced-size gate electrode 126 if channel length reduction is not desired for particular transistor sizes.

Referring to FIG. 2F, an amorphized implant 152 is implanted deeply into the source region 142 and the region 148 formerly underlying the gate electrodes 132. Various species are implanted in the amorphized implant 152 including silicon (Si), argon (Ar), germanium (Ge), cobalt (Co) and carbon (C), for example. In one example, the amorphized implant 152 is performed by implanting argon with a dosage in the range of $1 \times 10^{15}$ to $5 \times 10^{16}$ atoms/cm$^2$ and an energy in the range of 10 to 100 kiloelectron-volts (keV). The amorphized implant 152 is implanted in a range from 0.2 $\mu$m to 0.5 $\mu$m, substantially deeper than source implants or lightly-doped drain (LDD) implants, to restrict the diffusion of boron and arsenic into the region 148 on the source side of the reduced-size gate electrode 126.

The amorphized implant 152 is performed to retard diffusion of ions in the source and drain regions. By retarding the diffusion of ions in these regions, a shallower junction is advantageously created in the silicon regions of the wafer 106. A slight degradation in leakage current is obtained if the amorphized implant 152 is performed on both the source and the drain sides of a transistor. However, since the source region 142 is a low voltage region with a very shallow junction, MOSFETs in both n-channel an d p-channel regions are formed with improved performance and reliability.

The silicon wafer 106 is amorphized by implanting species such as silicon (Si) or germanium (Ge) to retard diffusion of source/drain regions a nd thereby produce shallow junctions in semiconductor devices. Ion implantation creates crystalline defects and impurities by bombarding energized ions into the silicon substrate lattice. When the energized ions strike the silicon substrate, energy is lost from the ions in a series of nuclear and electronic collisions and the ions come to rest hundreds of layers of atoms beneath the substrate surface. The nuclear collisions result in displaced silicon atoms which are also called damage or disorder. The damage resulting from ion implantation forms a variety of damage configurations including essentially crystalline silicon with isolated point defects or point defect clusters, local zones of completely amorphous material in an otherwise crystalline layer, and continuous amorphous layers which form as the damage from the ions accumulates. Regardless of the form of the damage configuration, the number of displaced atoms after implant is almost always larger than the number of implanted atoms. The displaced atoms reduce mobility in the damaged regions and produce defect levels in the band gap of the material which have a strong tendency to capture free carriers from the conduction and valence bands.

Ion implantation greatly improves control of the dopant concentration within the substrate, however additional control is needed to further reduce structure sizes and to improve the precision of dopant concentrations within the substrate, particularly in the vicinity of junctions. Usage of the amorphized implant 152 supplies the additional control of dopant concentration to advantageously improve transistor performance. Improved control achieved using the amorphized implant 152 is particularly useful for precisely setting threshold voltage $V_T$ and preventing "punchthrough".

An advantage of the amorphized implant 152 to convert a region of the silicon wafer 106 from a crystalline structure to an amorphous structure is that individual dopants or impurities are individually excited without driving or diffusing the impurities too deep into the substrate. Shallow junctions are advantageously formed and impurities are more completely activated. An additional advantage of the amorphized implant 152 to convert the substrate from a crystalline structure to an amorphous structure is that deposition of a blanket oxide layer is made optional. In many conventional semiconductor processing operations, a layer of blanket silicon dioxide (oxide) is deposited on the surface of a substrate wafer to convert the substrate structure at the surface of the wafer to an amorphous structure and thereby avoid the effects of channeling. The illustrative system and method makes the usage of the blanket oxide layer optional since the application of thermal energy to the silicon wafer 106 during implantation inherently converts the silicon wafer 106 to an amorphous structure so that the oxide layer is unnecessary. Optional deletion of a silicon oxide deposition step is advantageous for the processing of some circuits by allowing better control of implantation or diffusion directly into the substrate. Optional deletion of a silicon oxide deposition step is also advantageous for the processing of some circuits by reducing the number of processing steps, thereby reducing fabrication costs.

An annealing procedure may be applied following the amorphized implant 152 and prior to a source implant. A suitable annealing procedure includes rapid thermal annealing (RTA) and annealing using conventional heat sources.

Figure 2G:
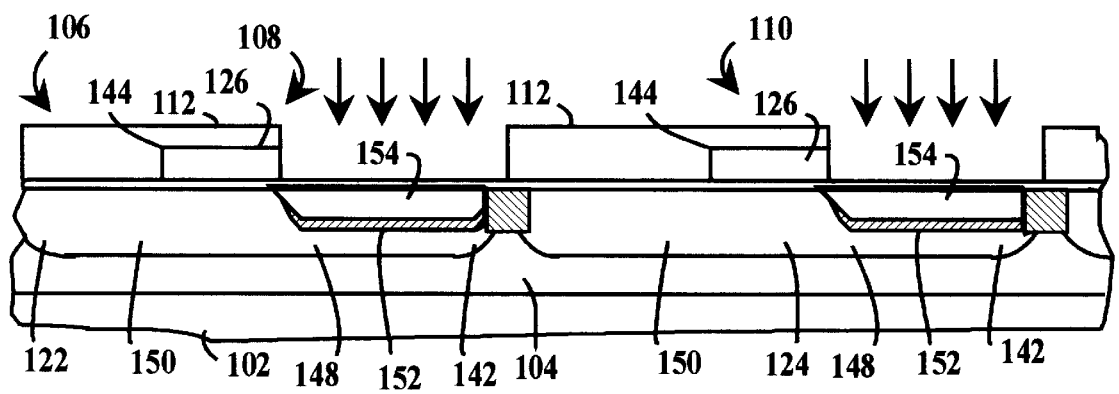
Figure 2H:
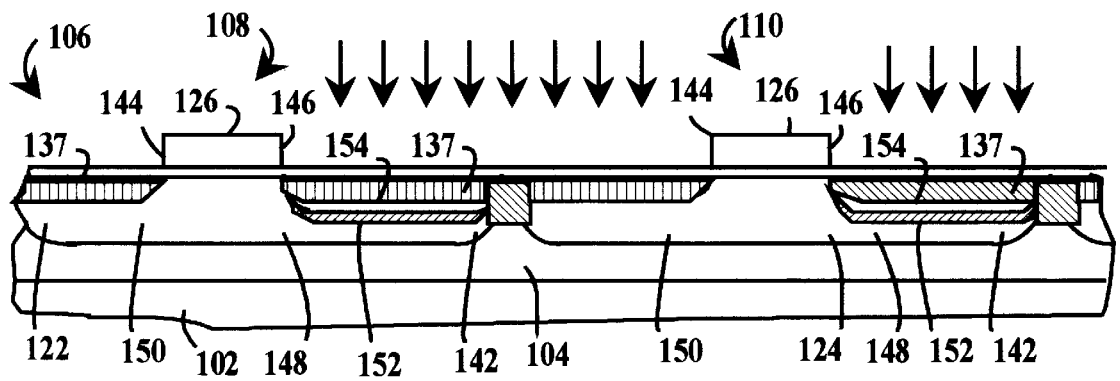

Referring to FIG. 2G, a source implant 154 is applied extending to a depth less than the amorphized implant 152.

Referring to FIG. 2R, the source mask 112 is stripped and lightly-doped drain regions 137 are formed in both the p-channel transistor 110 and the n-channel transistor 108. The lightly-doped drain (LDD) regions 137 of a device such as a p-channel transistor 110 are formed by ion implantation. The lightly doped source/drain (LDD) regions 137 are formed by implanting the silicon wafer 106 with arsenic at a dosage in the range of $1\times10^{13}$ to $5\times10^{14}$ atoms/cm$^2$ and an energy in the range of 2 to 50 kiloelectron-volts, using the reduced-size gate electrode 126 as an implant mask. Lightly doped source/drain regions 137 are self-aligned to the first edge 144 and a second edge 146 of the gate electrode 126 and are doped N– with an arsenic concentration in the range of $1\times10^{17}$ to $1\times10^{18}$ atoms/cm$^3$ and a junction depth in the range of 100 to 1500 angstroms.

In advanced CMOS processes, gate lengths are sufficiently short that lightly doped drain (LDD) structures are used to minimize hot-electron effects. LDD structures are used to absorb potential into the drain and thereby reduce the maximum electric field $E_M$ in a device. The LDD structure is formed using two implants, the first self-aligned to the gate electrode extended by the source mask 112 and the second self-aligned to the reduced-size gate electrode 126. The second implant is a lighter dose and forms a lightly doped section of the drain at the edge of the gate electrode on the drain side of the reduced-size gate electrode 126 alone, near the channel. The value of maximum electric field $E_M$ is reduced since the voltage drop is shared by the drain and the channel. The first implant is a heavier dose applied to the source region 142 alone, leaving a low resistivity region of the drain region.

Figure 2I:
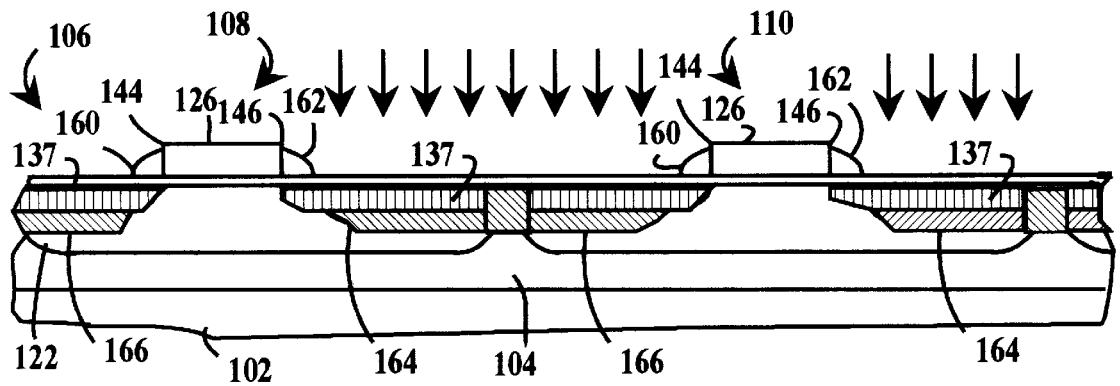

Referring to FIG. 2I, gate sidewall spacers 160 and 162 are formed on the sides of the reduced-size gate electrode 126 by processes including deposition of a polysilicon layer and isotropic etching. For example, in some embodiments Thereafter, an oxide layer with a thickness in the range of 600 to 2000 angstroms is conformally deposited over the exposed surfaces by CVD at a temperature in the range of 300 to 400° C., and the silicon wafer 106 is subjected to an isotropic etching or reactive ion etch (RIE) that forms sidewall spacers 160 and 162 adjacent to the first edge 144 and a second edge 146 of the gate electrode 126. The RIE also removes the regions of gate oxide outside reduced-size gate electrode 126 and spacers 160 and 162.

Heavily doped source/drain regions 164 and 166 are implanted into the silicon wafer 106 by subjecting the structure to ion implantation of arsenic, at a dosage in the range of $1\times10^{15}$ to $5\times10^{16}$ atoms/cm$^2$ and an energy in the range of 2 to 50 kiloelectron-volts, using the reduced-size gate electrode 126 and sidewall spacers 160 and 162 as an implant mask. Heavily doped source/drain regions 164 and 166 are self-aligned to the outside edges of the sidewall spacers 160 and 162 and doped N+ with an arsenic concentration in the range of about $1\times10^{18}$ to $5\times10^{20}$ atoms/cm$^3$ and a junction depth in the range of 200 to 1500 angstroms. The junction depth of heavily doped source/drain regions 164 and 166 exceeds the depth of the lightly doped source/drain regions 137. The heavy dose of arsenic also supplies sufficient doping that reduced-size gate electrode 126 is conductive.

Several techniques are alternatively performed to form shallow source/drain junctions for submicron CMOS devices. In one example, arsenic is implanted for N-channel devices and $BF_2^+$ is implanted for P-channel devices since both species have shallow ranges at typical implant energies of 30 keV to 50 keV implanted through a screen oxide to protect source-drain regions from implant contamination.

Finally, the silicon wafer 106 is annealed to remove crystalline damage and to activate and drive-in the implanted arsenic using a rapid thermal anneal (RTA) technique, applied at a temperature of approximately 950 to 105° C. for about 10 to 60 seconds. The implanted arsenic in the silicon wafer 106 diffuses laterally and vertically so that source regions 142 merge to supply a source, and drain regions 150 merge to provide a drain for an N-channel MOSFET with reduced-size gate electrode 126 supplying the gate.

Figure 3A:
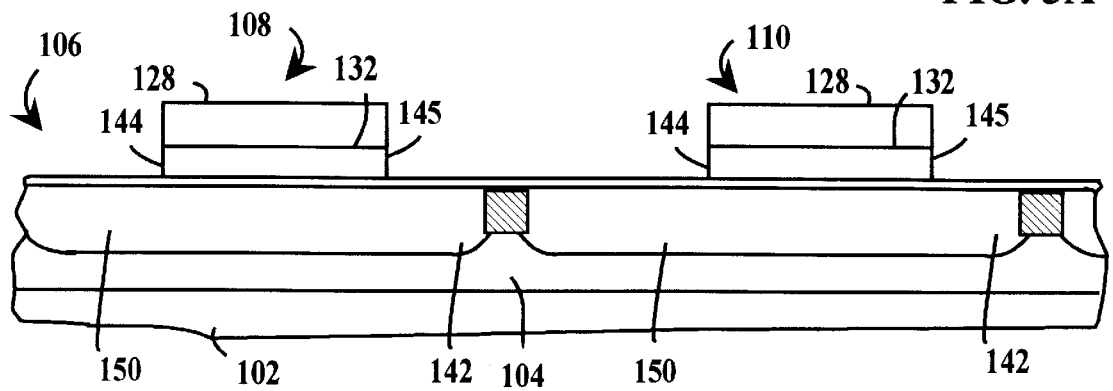
FIGS. 3A through 3F are schematic cross-sectional views of a semiconductor wafer illustrating, in summary, several pertinent process steps for forming an amorphized source MOSFET in accordance with a second embodiment of the present invention.

Referring to FIGS. 3A through 3E, schematic cross-sectional views of a semiconductor wafer summarize several pertinent process steps for forming an additional embodiment of an amorphized source MOSFET. Referring to FIG. 3A, a schematic cross-sectional view illustrates a silicon wafer 106 following formation of gate electrodes 132 for fabrication of an n-channel transistor 108 and a p-channel transistor 110, respectively including a source region 142 and a drain region 150 in the silicon wafer 106. The gate electrodes 132 are etched using conventional photolithographic techniques, applying a first gate photoresist mask 128 to cut a first edge 144 and a second edge 145 and forming a gate width that is determined by the resolution of the photolithographic system. The first gate photoresist mask 128 includes an opening that defines the first edge 144 and the second edge 145 of the gate electrode 132.

Figure 3B:
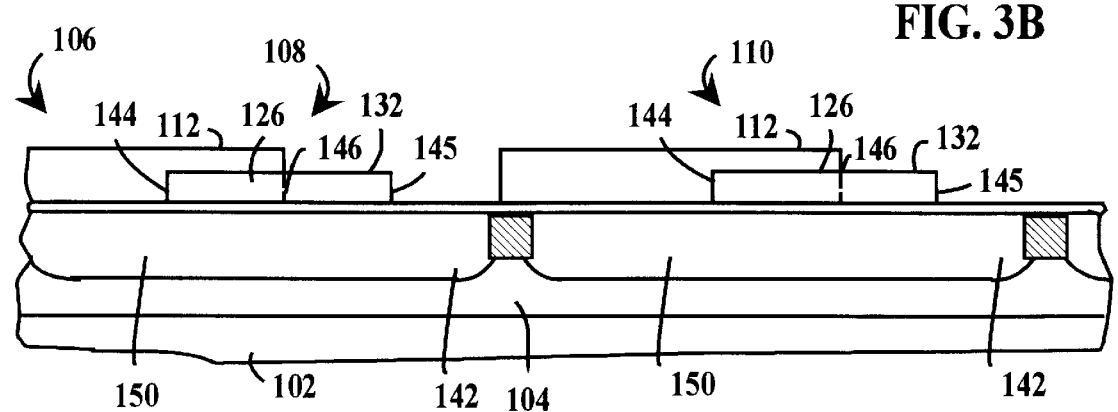

Referring to FIG. 3B, a source mask 112 is formed overlying the drain region 150 of the silicon wafer 106 and overlying a portion of the gate electrodes 132. The source mask 112 has an opening defining a second edge 146 of the reduced-size gate electrode 126 and extending across the source region 142 so that the source region 142 is exposed.

Figure 3C:
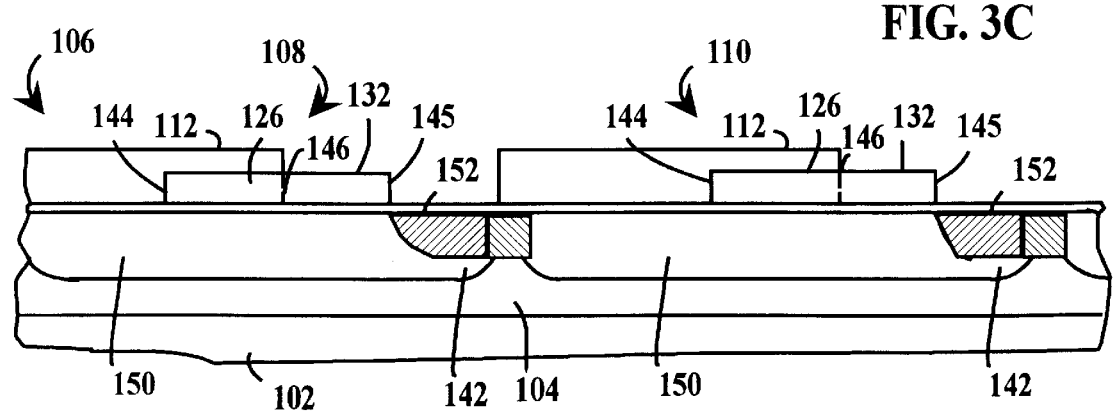

Referring to FIG. 3C, while the source mask 112 is in position extending partially over the gate electrodes 132, an amorphized implant 352 is implanted to a relatively deep depth into the silicon wafer 106 in the source region 142. In some embodiments, an annealing procedure is applied following the amorphized implant 352 and prior to a source implant.

Figure 3D:
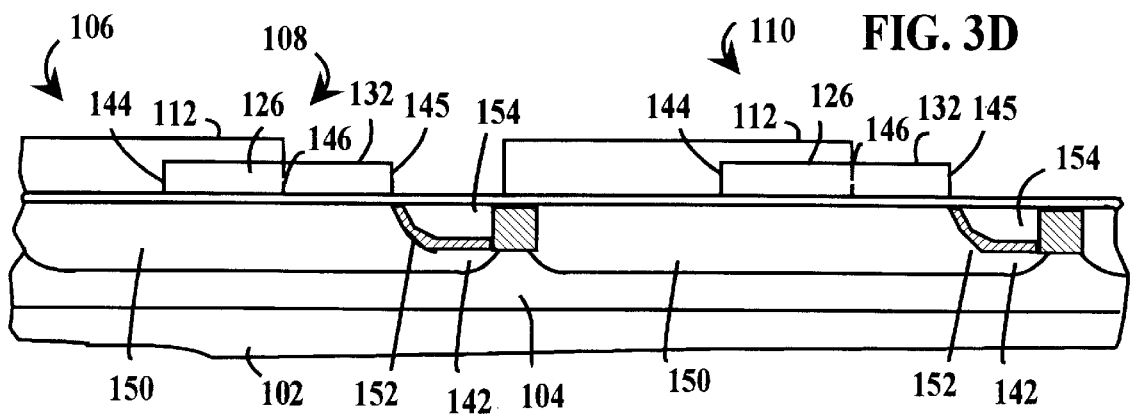

Referring to FIG. 3D, a source implant 354 is implanted into the source region 142 while the source mask 112 remains in position extending partially over the gate electrodes 132. The source implant 354 is implanted to depth that is substantially shallower than the amorphized implant 352. The amorphized implant 352 is implanted substantially deeper than the source implant 354 and LDD implants to restrict the diffusion of boron and arsenic into the region 148 on the source side of the reduced-size gate electrode 126.

Figure 3E:
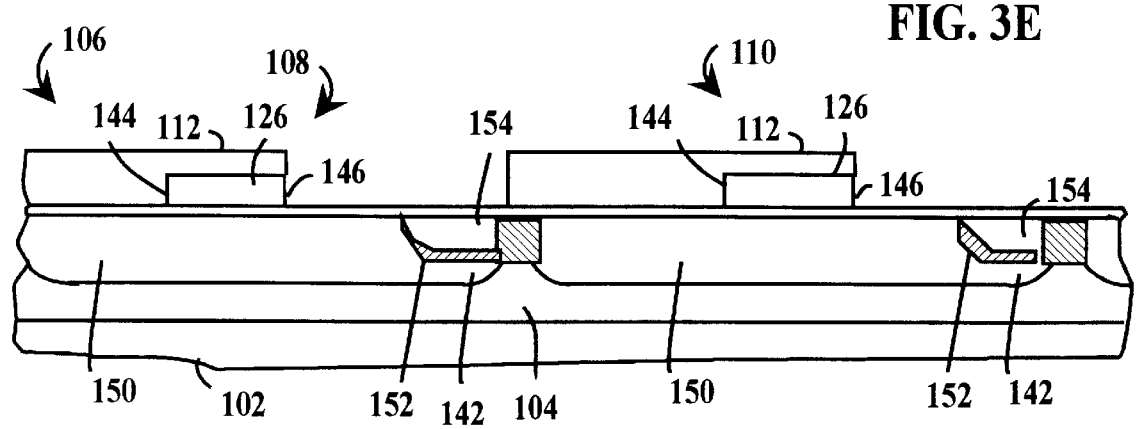

Referring to FIG. 3E, the nonconventional gate etch technique is used to form a reduced-size gate electrode 126 in which the length between the first edge 144 and a new second edge 146 of the gate electrode 126 is not limited by the minimum resolution of a photolithographic system. The reduced-size of the gate electrode 126 is formed using the first gate photoresist mask 128 for defining the size of the gate electrodes 132 and setting the first edge 144 of the gate electrodes 132, and the source mask 112. A portion of the gate electrode 132 is removed to form a reduced-size gate electrode 126 by etching the gate electrodes 132 to the second edge 146 at the edge of the source mask 112.

Figure 3F:
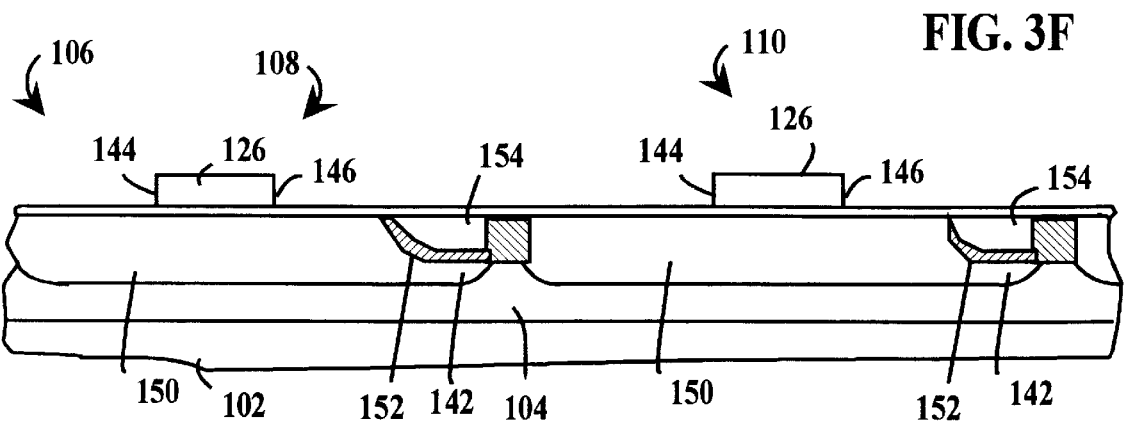

Referring to FIG. 3F, the source mask 112 is stripped, leaving the reduced-size gate electrode 126 on the surface of the silicon wafer 106. In subsequent steps, LDD regions are formed for both n-channel transistor 108 and p-channel transistor 110, sidewall spacers (not shown) are formed on the sides of the reduced-size gate electrodes 126, heavily doped n+ and p+ regions are formed, and the silicon wafer 106 is annealed, typically using a rapid thermal anneal procedure.

Figure 4:
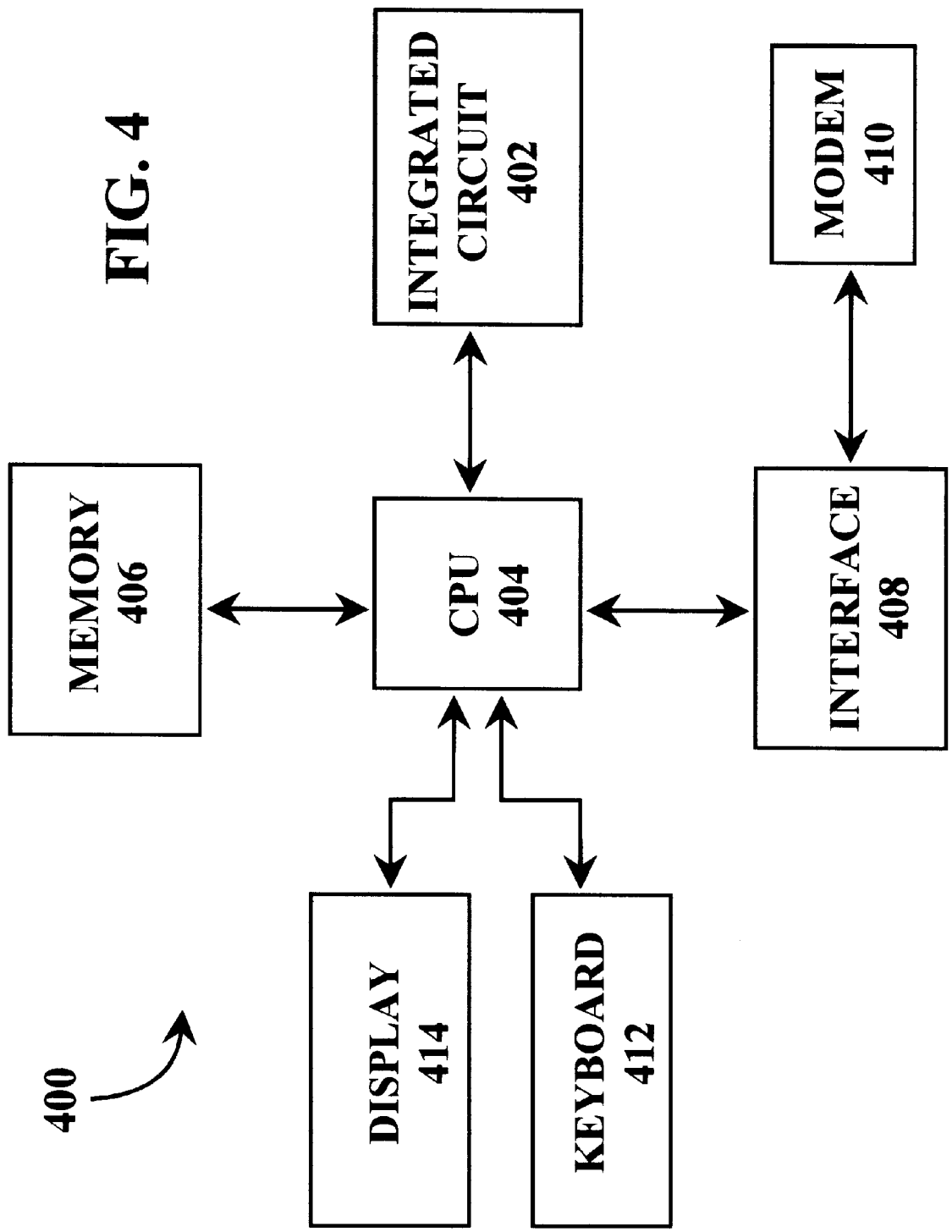
FIG. 4 is a schematic block diagram illustrating a computer system including an integrated circuit with an amorphized source MOSFET fabricated using a method as depicted in FIGS. 1A–1F, 2A–2I, and 3A–3F.

Referring to FIG. 4, a computer system 400 includes an integrated circuit 402, a central processing unit 404, a memory 406, and an interface 408, connected to a modem 410. The computer system 400 also includes a keyboard 412 and a display 414 forming a user interface.

While the invention has been described with reference to various embodiments, it will be understood that these embodiments are illustrative and that the scope of the invention is not limited to them. Many variations, modifications, additions and improvements of the embodiments described are possible. For example, those skilled in the art will readily implement the steps necessary to provide the structures and methods disclosed herein, and will understand that the process parameters, materials, and dimensions are given by way of example only and can be varied to achieve the desired structure as well as modifications which are within the scope of the invention. Variations and modifications of the embodiments disclosed herein may be made based on the description set forth herein, without departing from the scope and spirit of the invention as set forth in the following claims.

What is claimed is:

1. An integrated circuit comprising:

a semiconductor substrate;

a gate electrode over the semiconductor substrate, the gate electrode having a gate width smaller than the minimum resolution of a photolithographic system used to etch the gate electrode;

a source region in the semiconductor substrate adjacent to a first side of the gate electrode;

a drain region in the semiconductor substrate adjacent to a second side of the gate electrode;

an amorphous implant implanted into the source region of the semiconductor substrate, the amorphous implant being self-aligned with the gate electrode and asymmetrically implanted into the source region in exclusion of the drain region;

a source implant implanted into the source region of the semiconductor substrate to a depth shallower than the depth of the amorphous implant;

a drain implant implanted into the drain region of the semiconductor substrate; and lightly-doped drain (LDD) regions implanted into the source region and the drain region of the semiconductor substrate, the LDD regions being implanted to a depth shallower than the source implant.

2. An integrated circuit comprising:

a semiconductor substrate;

a gate electrode over the semiconductor substrate, the gate electrode having a gate width smaller than the minimum resolution of a photolithographic system used to etch the gate electrode;

a source region in the semiconductor substrate adjacent to a first side of the gate electrode;

a drain region in the semiconductor substrate adjacent to a second side of the gate electrode;

an amorphous implant implanted into the source region of the semiconductor substrate, the amorphous implant being self-aligned with the gate electrode and asymmetrically implanted into the source region in exclusion of the drain region;

a source implant implanted into the source region of the semiconductor substrate to a depth shallower than the depth of the amorphous implant;

a drain implant implanted into the drain region of the semiconductor substrate; and spacers coupled to lateral edges of the gate electrodes.

3. An electronic system including a microprocessor, a memory, a system bus and an integrated circuit comprising:

a semiconductor substrate;

a gate electrode over the semiconductor substrate, the gate electrode having a gate width smaller than the minimum resolution of a photolithographic system used to etch the gate electrode;

a source region in the semiconductor substrate adjacent to a first side of the gate electrode;

a drain region in the semiconductor substrate adjacent to a second side of the gate electrode;

an amorphous implant implanted into the source region of the semiconductor substrate, the amorphous implant being self-aligned with the gate electrode and asymmetrically implanted into the source region in exclusion of the drain region;

a source implant implanted into the source region of the semiconductor substrate to a depth shallower than the depth of the amorphous implant;

a drain implant implanted into the drain region of the semiconductor substrate.

* * * * *